(12) United States Patent
Kurokawa (10) Patent No.: US 7,881,693 B2
(45) Date of Patent: Feb. 1, 2011

(54) SEMICONDUCTOR DEVICE (75) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 647 days.

(21) Appl. No.: 11/868,027

(22) Filed: Oct. 5, 2007

(65) Prior Publication Data
US 2008/0214132 A1    Sep. 4, 2008

(30) Foreign Application Priority Data
Oct. 17, 2006    (JP)    ............... 2006-282084

(51) Int. Cl.
*H04B 1/16* (2006.01)

(52) U.S. Cl. .......... 455/343.1; 455/127.1; 455/572; 455/571; 340/572.8; 235/380

(58) Field of Classification Search ............. 455/343.1, 455/127.1, 572, 571, 13.4; 340/572.8; 235/380
See application file for complete search history.

(56) References Cited

U.S. PATENT DOCUMENTS

| | | | |
|---|---|---|---|
| 6,549,064 B2 * | 4/2003 | Bandy et al. ........... | 327/536 |
| 6,914,447 B2 * | 7/2005 | Baumann ............... | 324/765 |
| 7,081,635 B2 * | 7/2006 | Baumann ............... | 250/493.1 |
| 7,710,240 B2 * | 5/2010 | Kang et al. ............ | 340/10.1 |
| 2004/0212388 A1 * | 10/2004 | Baumann ............... | 324/765 |
| 2005/0052283 A1 | 3/2005 | Collins et al. | |
| 2005/0134463 A1 | 6/2005 | Yamazaki | |
| 2005/0186904 A1 | 8/2005 | Kowalski et al. | |
| 2005/0254183 A1 | 11/2005 | Ishida et al. | |
| 2009/0230988 A1 * | 9/2009 | Nieuwland et al. ..... | 326/9 |
| 2010/0019907 A1 * | 1/2010 | Shanks ................ | 340/572.5 |

FOREIGN PATENT DOCUMENTS

| | | |
|---|---|---|
| JP | 07-057067 | 3/1995 |
| JP | 10-307898 | 11/1998 |
| JP | 2003-070187 | 3/2003 |
| JP | 2005-202947 | 7/2005 |
| JP | 2005-354888 | 12/2005 |
| JP | 2006-004015 | 1/2006 |

OTHER PUBLICATIONS

Search Report, European Application No. 07019954.2; dated Nov. 17, 2010, 6 pages.

* cited by examiner

*Primary Examiner*—Minh D Dao
(74) *Attorney, Agent, or Firm*—Fish & Richardson P.C.

(57) ABSTRACT

In an RF tag, a mask ROM or a flash memory is used for storing data such as an ID number. Although the mask ROM can be realized at a low price, rewriting is not possible. In addition, in the flash memory, although electric rewriting is possible, production cost increases. Accordingly, it is difficult to provide an RF tag by which data rewriting is possible at a low price. An RF tag is provided with a power supply circuit having a function to generate a power supply voltage from a weak radio signal and a memory which can hold data stored in a data holding portion by the power supply voltage. With the above structure, a high-performance RF tag capable of rewriting data such as an ID number after production can be provided at a low price.

30 Claims, 6 Drawing Sheets

SEMICONDUCTOR DEVICE

BACKGROUND OF THE INVENTION

1. Field of the Invention

The present invention relates to a semiconductor device which transmits and receives data by a radio signal.

2. Description of the Related Art

In recent years, a compact semiconductor device (hereinafter, an RF tag) that is a combination of an ultra compact IC chip and an antenna for wireless communication has received a lot of attention. The RF tag is known as an information medium which incorporates a semiconductor memory and which can read information stored in the semiconductor memory or can write information in the semiconductor device by radio waves from a wireless communication device (hereinafter, a reader/writer).

For example, an RF tag in which a communication circuit, a signal control circuit, and a memory portion are formed in a semiconductor integrated circuit and they are combined with an antenna is disclosed (e.g., refer to Patent Document 1).

As an application field of the RF tag, merchandise management in the distribution industry is given as an example. Although merchandise management utilizing a barcode has been a mainstream recently, since a barcode including data is read optically, data cannot be read when there is a shield. On the other hand, since the RF tag reads data wirelessly, the data can be read even if there is a shield as long as radio waves are transmitted. Consequently, an improvement in efficiency and reduction in cost of merchandise management, and the like are expected. In addition, the RF tag is expected to be widely applied to, for example, train tickets, airplane tickets, and automatic resets.

Patent Document 1: Japanese Published Patent Application No. 2005-202947

SUMMARY OF THE INVENTION

The RF tag has a function of transmitting and receiving data such as unique number (ID data) with a reader/writer. A nonvolatile memory such as a flash memory or a mask ROM (Read Only Memory) is used for storing ID data. When a flash memory is used for storing ID data, there is an advantage in that data can be electrically rewritten many times. However, because of long read-out time, it is hard to improve operating frequency of the RF tag and to provide a high-performance RF tag. In addition, since a high voltage is necessary for writing in a flash memory, a special booster circuit is necessary, and it is difficult to provide an inexpensive RF tag. Furthermore, since the number of processes increases, production cost increases and it is further difficult to provide an inexpensive RF tag.

On the other hand, when a mask ROM is used for storing ID data, there is an advantage in that an RF tag can be provided at a very low price, compared with the case of using a flash memory. However, since data of the mask ROM is determined in a production process and data rewriting is incapable after production, convenience of the RF tag is to be lost.

In view of the foregoing problems, the present invention provides an RF tag provided with a power supply circuit having a function of generating a power supply voltage from a weak radio signal and a memory which can hold data stored in a data holding portion by the power supply voltage. With the above-described structure, a high-performance RF tag which can electrically rewrite data such as ID data after production can be provided at a low price.

One structure of the present invention disclosed in this specification includes a first antenna circuit, a second antenna circuit, a first power supply circuit, a second power supply circuit, and a memory circuit, in which a first radio signal is converted into a first alternating voltage in the first antenna circuit; a second radio signal is converted into a second alternating voltage in the second antenna circuit; the first power supply circuit generates a first direct voltage from the first alternating voltage; the second power supply circuit generates a second direct voltage from the second alternating voltage; when only the first direct voltage of the first direct voltage and the second direct voltage is supplied to the memory circuit, the memory circuit holds data by using the first direct voltage which is supplied; and when the first direct voltage and the second direct voltage are supplied to the memory circuit, the memory circuit holds data by using the first direct voltage and the second direct voltage which are supplied.

Another structure of the present invention disclosed in this specification includes a first antenna circuit, a second antenna circuit, a first power supply circuit, a second power supply circuit, and a memory circuit, in which a radio signal is converted into a first alternating voltage in the first antenna circuit; the radio signal is converted into a second alternating voltage in the second antenna circuit; the first power supply circuit generates a first direct voltage from the first alternating voltage; the second power supply circuit generates a second direct voltage from the second alternating voltage; when only the first direct voltage of the first direct voltage and the second direct voltage is supplied to the memory circuit, the memory circuit holds data by using the first direct voltage which is supplied; and when the first direct voltage and the second direct voltage are supplied to the memory circuit, the memory circuit holds data by using the first direct voltage and the second direct voltage which are supplied.

In addition, the first radio signal and the second radio signal may have different frequencies.

In addition, the first radio signal and the second radio signal may have different electric powers.

In addition, one of the first power supply circuit and the second power supply circuit may be a charge pump circuit.

In addition, the memory circuit may be a latch circuit.

In addition, the memory circuit may be a flip-flop circuit.

In addition, the memory circuit may be an SRAM (Static Random Access Memory).

In addition, the first power supply circuit, the second power supply circuit, or the memory circuit may be formed using a thin film transistor in which a semiconductor thin film formed over a substrate including an insulating surface serves as an active layer.

Note that the substrate including the insulating surface is desirably any one of a glass substrate, a quartz substrate, a plastic substrate, and an SOI (Silicon On Insulator) substrate.

According to the present invention, a high-performance RF tag which can electrically rewrite data such as ID data after production can be provided at a low price.

DETAILED DESCRIPTION OF THE INVENTION

Hereinafter, embodiment modes of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiment modes. Through the drawings of the embodiment modes, the same components or components having the same functions are denoted by the same reference numerals and will not be further explained.

Embodiment Mode 1

Figure 1:
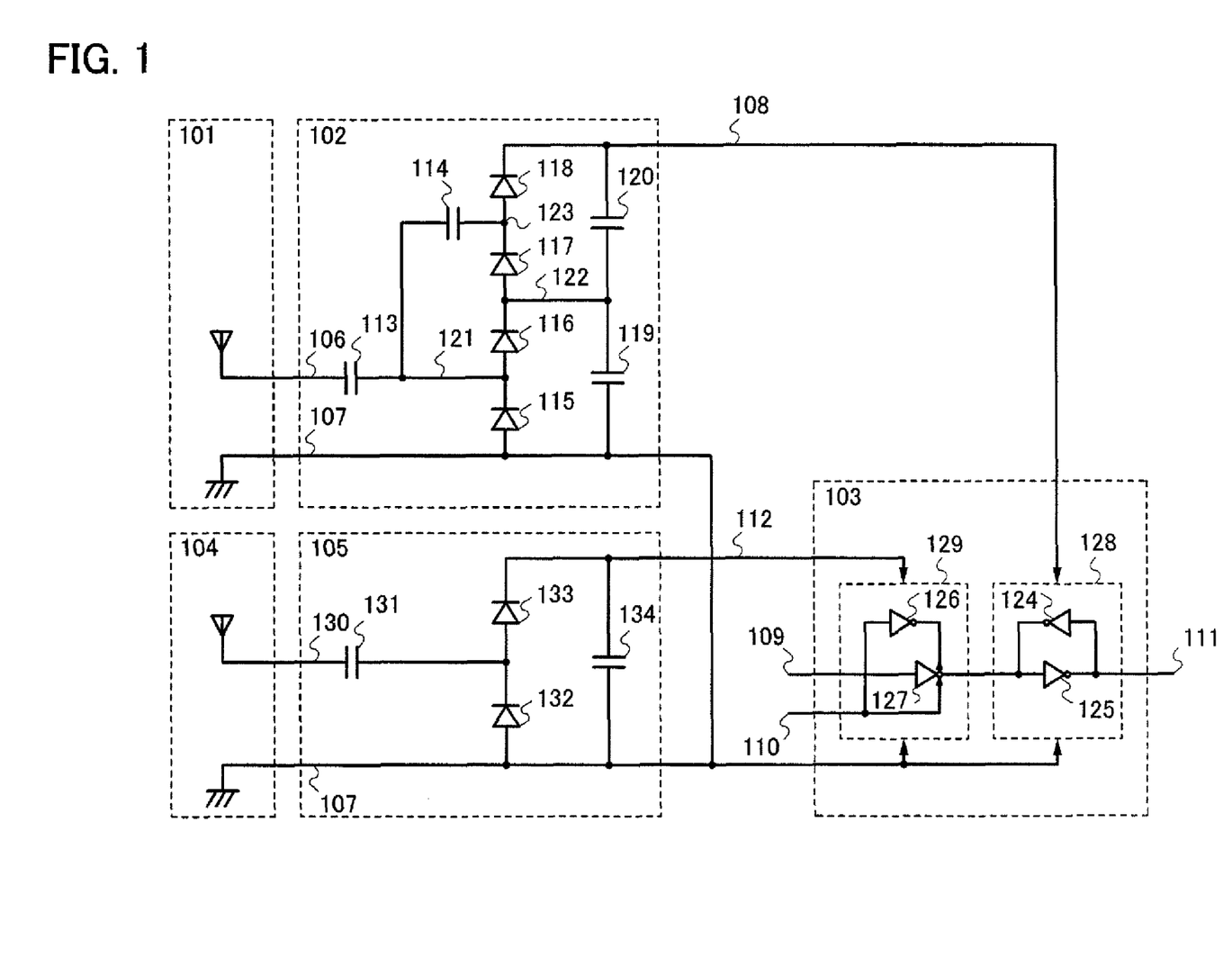
FIG. 1 is a first circuit diagram of a power supply circuit and a memory circuit which are mounted on a semiconductor device of the present invention.

Embodiment Mode 1 in which a power supply circuit and a memory circuit to be mounted on an RF tag of the present invention will be described with reference to FIG. 1. FIG. 1 is a circuit diagram of the power supply circuit and the memory circuit to be mounted on the RF tag of the present invention. In FIG. 1, there are a first antenna circuit 101, a first power supply circuit 102, a memory circuit 103, a second antenna circuit 104, and a second power supply circuit 105.

The first antenna circuit 101 has a function to generate a first alternating voltage between a first antenna input wiring 106 and a ground wiring 107 when the first antenna circuit 101 receives a first weak radio signal. Specifically, for example, the above function can be realized as long as the first antenna circuit 101 has a coil in the case where an electromagnetic induction method is used for receiving a first communication signal, or the above function can be realized as long as the first antenna circuit 101 has a dipole antenna in the case where an electric field method is used.

The first power supply circuit 102 generates a first power supply voltage which is a direct voltage from the first alternating voltage, and supplies it to a first power source wiring 108. In FIG. 1, the first power supply circuit 102 is formed of a two-stage charge pump including a first coupling capacitor 113, a second coupling capacitor 114, first to fourth diodes 115 to 118, a first storage capacitor 119, and a second storage capacitor 120.

Here, the operation of this charge pump is described. First, the first coupling capacitor 113 converts the first alternating voltage supplied from the first antenna circuit 101 into a first alternating current, and supplies the first alternating current to a wiring 121. A first rectifier circuit which is formed of the first diode 115 and the second diode 116 rectifies the first alternating current, generates a first rectified current, and supplies the first rectified current to a wiring 122. In addition, charge is stored in the first storage capacitor 119 due to the first rectified current supplied from the first rectifier circuit. At this time, a potential of the wiring 122 serves as a third power supply voltage.

Next, the second coupling capacitor 114 supplies a second alternating current to a wiring 123. A second rectifier circuit which is formed of the third diode 117 and the fourth diode 118 rectifies the second alternating current, generates a second rectified current, and supplies the second rectified current to the first power source wiring 108. In addition, charge is stored in the second storage capacitor 120 due to the second rectified current supplied from the second rectifier circuit. At this time, a potential of the first power source wiring 108, which equals to the sum of the third power supply voltage and the voltage of the second storage capacitor 120, serves as the first power supply voltage. That is, the first power supply voltage is generated by rectifying and boosting the first alternating voltage.

The second antenna circuit 104 has a function to generate a second alternating voltage between a second antenna input wiring 130 and the ground wiring 107 when the second antenna circuit 104 receives a second radio signal. Specifically, for example, the above-described function can be realized when the second antenna circuit 104 has a coil in the case where an electromagnetic induction method is used for receiving a second communication signal, or the above-described function can be realized when the second antenna circuit 104 has a dipole antenna in the case where an electric field method is used.

The second power supply circuit 105 generates a second power supply voltage which is a direct voltage from the second alternating voltage, and supplies the second power supply voltage to a second power source wiring 112. In FIG. 1, the second power supply circuit 105 includes a third coupling capacitor 131, a fifth diode 132, a sixth diode 133, and a third storage capacitor 134.

The memory circuit 103 has a function to store a potential of an input data signal supplied from an input data signal line 109 when a write control signal supplied from a write control signal line 110 is at an "H" level. In addition, the memory circuit 103 has a function to output the stored potential as an output data signal from an output data signal line 111. Specifically, for example, the above-described function can be realized when a latch circuit including first to third inverters 124 to 126 and a clock inverter 127 is used as the memory circuit 103. Here, a power supply voltage of a data holding portion 128 formed of the first inverter 124 and the second inverter 125 is the first power supply voltage. In addition, a power supply voltage of a write control portion 129 including the third inverter 126 and the clock inverter 127 is the second power supply voltage. Note that the second power supply voltage can be supplied to a circuit other than the memory circuit 103 in the RF tag, in addition to the write control portion 129.

In the write control portion 129, when a write control signal supplied from the write control signal line 110 is at an "H" level, the output of the third inverter 126 is at an "L" level. At this time, in the case where input data signal supplied from the input data signal line 109 is at an "H" level or an "L" level, the clock inverter 127 outputs an "L" level signal or an "H" level signal, and data "H" or data "L" is stored in the data holding portion 128, respectively. Note that "H" means that a signal is at a high-level state, and "L" means that a signal is at a low-level state.

Here, storing data "H" or data "L" in the data holding portion 128 means that the first inverter 124 outputs an "L" level signal or an "H" level signal and the second inverter 125 outputs an "H" level signal or an "L" level signal, respectively; at this time, output data signal supplied to the output data signal line 111 is at an "H" level or at an "L" level, respectively.

In addition, when a write control signal is at an "L" level, the output of the third inverter 126 is at an "H" level. At this time, the clock inverter 127 outputs a floating potential regardless of a value of an input data signal supplied from the input data signal line 109. Accordingly, the data stored in the data holding portion 128 is not changed, and data is held.

The data stored in the data holding portion 128 is continued to be held while the first power supply voltage is being supplied. That is, the memory circuit 103 continues to hold data regardless of whether the second power supply voltage is supplied. In addition, here, when the first power supply circuit 102 has a structure as shown in FIG. 1, a high voltage can be supplied easily. That is, even when a first weak communication signal is used, a power supply voltage can be supplied to the data holding portion 128. Note that by generating a high voltage, a current value which can be supplied decreases; however, a very small current is consumed to hold the data stored in the data holding portion 128. Therefore, a power supply voltage which is sufficient to hold data can be supplied easily from the first power supply circuit 102 to the data holding portion 128.

Here, by using a general reader/writer for transmission and reception of a second communication signal and preparing a transmitter which transmits a first communication signal, the memory circuit 103 can hold data as follows. First, a first weak communication signal is continued to be supplied from the transmitter. Here, it is considered the case where the strength of the second communication signal decreases, that is, the case where communication with the reader/writer is not performed. At this time, the supply of the second power supply voltage to the memory circuit 103 is stopped in a wireless chip. However, since the first power supply voltage is continued to be supplied to the memory circuit 103, the data stored in the memory circuit 103 can be continued to be held. Next, it is considered the case where the strength of the second communication signal increases again, that is, the case where communication with the reader/writer is resumed. At this time, even when the supply of the second power supply voltage to the memory circuit 103 is resumed, the data stored in the memory circuit 103 can be used. That is, when a first weak communication signal is continued to be supplied to the wireless chip provided with the first power supply circuit 102 and the memory circuit 103 of this embodiment mode, the memory circuit 103 can hold data.

That is, the RF tag is provided with means for receiving electromagnetic waves of various wavelengths for a long term and for charging the energy thereof as electric energy. The charged electric energy is continued to be supplied to the memory circuit, so that the memory circuit can hold data. Note that, here, receiving electromagnetic waves of various wavelengths means that the electromagnetic waves including a pulse, a continuous wave, a modulated wave, and the like are taken as much as possible. In addition, the electromagnetic waves may target not only electric waves which propagate in the air but also electric waves which are intentionally emitted from a feeding unit.

Note that the same communication signal can be used as the first communication signal and the second communication signal. In this case, even when communication with the reader/writer is not performed, a weak communication signal may be supplied. Note that, with this communication signal, the first power supply voltage which is sufficient for the data holding portion 128 to continue to hold data can be supplied from the first power supply circuit 102. In this way, since there is no need to prepare another transmitter, installation cost of a transmitter can be reduced. Further, in this case, one antenna circuit can be used as the first antenna circuit 101 and the second antenna circuit 104.

Note that, in this embodiment mode, the example in which the two-stage charge pump is used as the first power supply circuit 102 is described; however, a three-stage charge pump, a charge pump with four or more stages, or a known charge pump may be used as well. In addition, the example in which a latch circuit is used as the memory circuit 103 is described; however, a flip-flop circuit may also be used. Further, a memory such as SRAM can be used. In this case, a power supply voltage to be supplied to a memory cell of the SRAM may be set as the first power supply voltage of this embodiment mode.

As described above, when the RF tag is provided with the power supply circuits and the memory circuit 103 of this embodiment mode, a high-performance RF tag which can electrically rewrite data such as ID data after production can be provided at a low price.

Embodiment Mode 2

Figure 2:
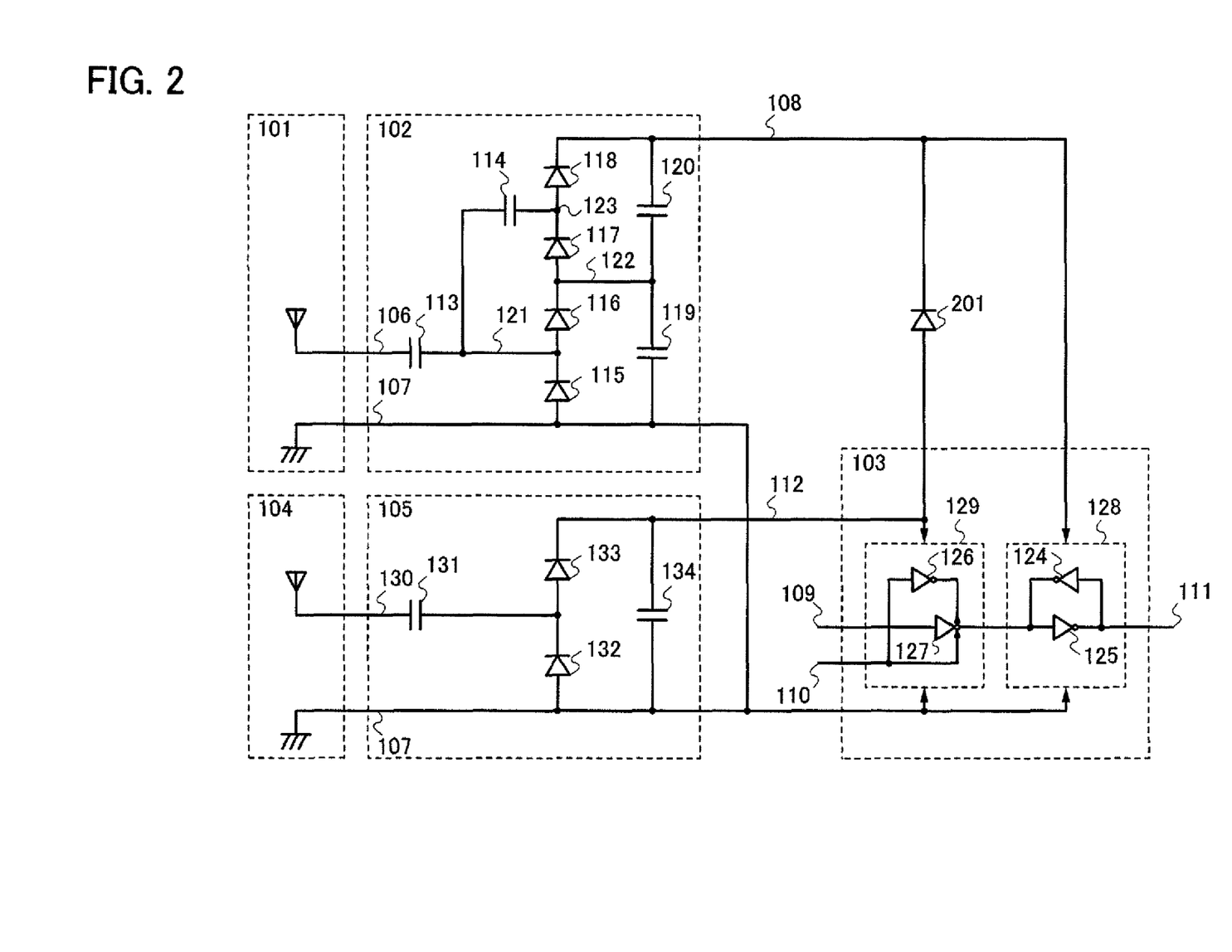
FIG. 2 is a second circuit diagram of a power supply circuit and a memory circuit which are mounted on a semiconductor device of the present invention.

Embodiment Mode 2 which is different from Embodiment Mode 1 where the power supply circuits and the memory circuit 103 are mounted on the RF tag of the present invention will be described with reference to FIG. 2. FIG. 2 is a circuit diagram of the power supply circuit and the memory circuit 103 which are mounted on the RF tag of the present invention.

In FIG. 2, the first antenna circuit 101, the first power supply circuit 102, the memory circuit 103, the second antenna circuit 104, and the second power supply circuit 105 can be described in much the same way as in FIG. 1 in Embodiment Mode 1. FIG. 2 is different from FIG. 1 described in Embodiment Mode 1 in that a diode 201 is inserted between the second power source wiring 112 and the first power source wiring 108.

The function of the diode 201 is as follows. That is, when a potential of the second power source wiring 112, namely, the second power supply voltage is higher than the potential of the first power source wiring 108, namely, the first power supply voltage, a current is supplied from the second power source wiring 112 to the first power source wiring 108 through the diode 201. With this current, charge is supplied to the second power source wiring 112, and the first power supply voltage is increased.

Here, by using a general reader/writer for transmission and reception of a second communication signal and preparing a transmitter which transmits a first communication signal, the memory circuit 103 can hold data as follows. First, a first weak communication signal is continued to be supplied from the transmitter. Here, it is considered the case where the strength of the second communication signal decreases, that is, the case where communication with the reader/writer is not performed. At this time, the supply of the second power supply voltage to the memory circuit 103 is stopped in a wireless chip. However, since the first power supply voltage is continued to be supplied to the memory circuit 103, the data stored in the memory circuit 103 can be continued to be held. Next, it is considered the case where the strength of the second communication signal increases again, that is, the case where communication with the reader/writer is resumed. At this time, even when the supply of the second power supply voltage to the memory circuit 103 is resumed, the data stored in the memory circuit 103 can be used. That is, when a first weak communication signal is continued to be supplied to the wireless chip provided with the first power supply circuit 102 and the memory circuit 103 of this embodiment mode, the memory circuit 103 can hold data.

When communication with the reader/writer is performed, the second power supply voltage generated in the second power supply circuit 105 is a higher voltage than the first power supply voltage generated in the first power supply circuit 102. Accordingly, with the operation of the diode 201, charge which is larger than the charge that can be stored only in the first power supply circuit 102 is stored in the second storage capacitor 120. Therefore, the data stored in the memory circuit 103 can be easily held.

Note that the same communication signal can be used as the first communication signal and the second communication signal. In this case, even when communication with the reader/writer is not performed, a weak communication signal may be supplied. Note that, with this communication signal, the first power supply voltage which is sufficient for the data holding portion 128 to continue to hold data can be supplied from the first power supply circuit 102. In this way, since there is no need to prepare another transmitter, installation cost of a transmitter can be reduced. Further, in this case, one antenna circuit can be used as the first antenna circuit 101 and the second antenna circuit 104.

Accordingly, with the operation of the diode 201, charge is stored in the second storage capacitor 120 from the first power supply circuit 102 and the second power supply circuit 105. Therefore, when communication with the reader/writer is not performed, a communication signal supplied from the reader/writer may be weaker. That is, even when communication with the reader/writer is not performed, the data stored in the memory circuit 103 can be easily held.

Note that, in this embodiment mode, the example in which the two-stage charge pump is used as the first power supply circuit 102 is described; however, a three-stage charge pump, a charge pump with four or more stages, or a known charge pump may be used as well. In addition, the example in which a latch circuit is used as the memory circuit 103 is described; however, a flip-flop circuit may also be used. Further, a memory such as SRAM can be used. In this case, a power supply voltage to be supplied to a memory cell of the SRAM may be set as the first power supply voltage of this embodiment mode.

As described above, when the RF tag is provided with the power supply circuit and the memory circuit 103 of this embodiment mode, a high-performance RF tag which can electrically rewrite data such as ID data after production can be provided at a low price.

Embodiment 1

Hereinafter, embodiments of the present invention will be described with reference to the accompanying drawings. However, the present invention can be implemented in various modes. As can be easily understood by a person skilled in the art, the modes and details of the present invention can be changed in various ways without departing from the spirit and scope of the present invention. Thus, the present invention should not be interpreted as being limited to the following description of the embodiments. Through the drawings of the embodiments, the same components or components having the same functions are denoted by the same reference numerals and will not be further explained.

Figure 3A:
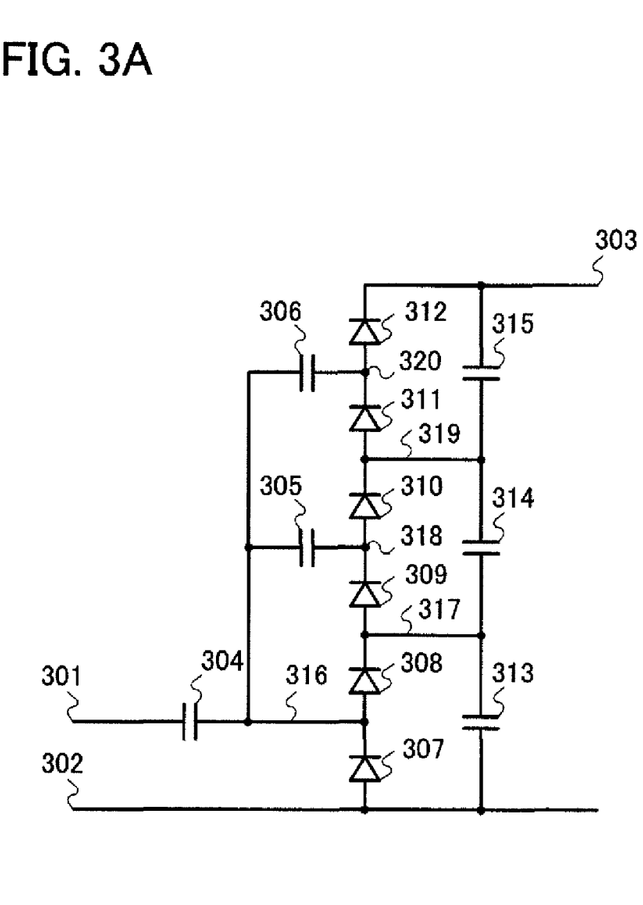
FIGS. 3A and 3B are each a circuit diagram of a power supply circuit which is mounted on a semiconductor device of the present invention.
Figure 3B:
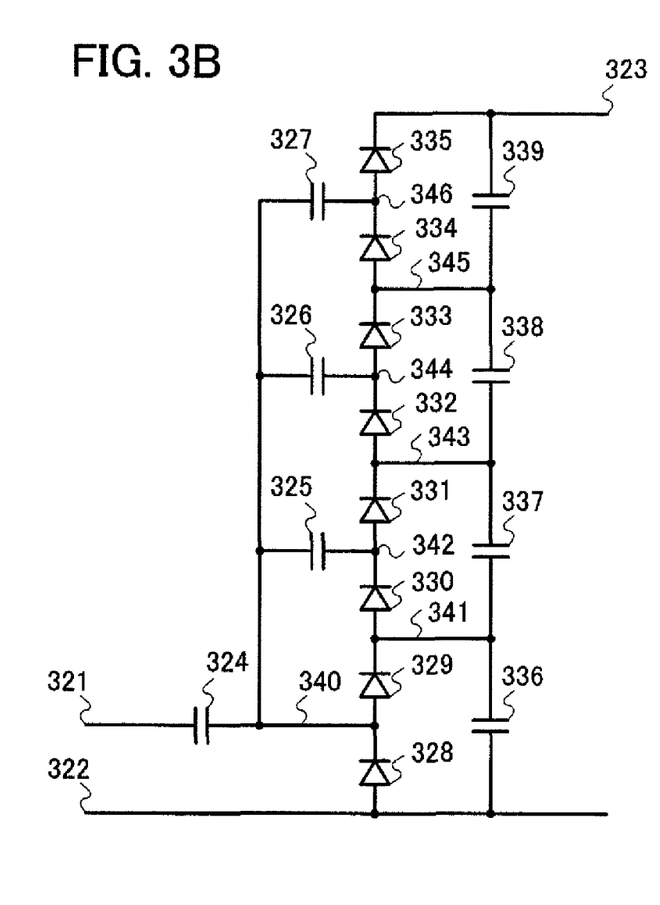

An embodiment in which a power supply circuit to be mounted on the RF tag of the present invention will be described with reference to FIGS. 3A and 3B. FIGS. 3A and 3B each are a circuit diagram of the power supply circuit to be mounted on the RF tag of the present invention.

In FIG. 3A, the power supply circuit is a three-stage charge pump including first to third coupling capacitors 304 to 306, first to sixth diodes 307 to 312, and first to third storage capacitors 313 to 315. The power supply circuit has a function to generate a power supply voltage which is a direct voltage and to supply the power supply voltage to a power source wiring 303 when an alternating voltage is inputted between an antenna input wiring 301 and a ground wiring 302.

Here, the operation of this charge pump is described. First, the first coupling capacitor 304 converts the alternating voltage supplied from the antenna input wiring 301 into a first alternating current, and supplies the first alternating current to a wiring 316. A first rectifier circuit which is formed of the first diode 307 and the second diode 308 rectifies the first alternating current, generates a first rectified current, and supplies the first rectified current to a wiring 317. In addition, charge is stored in the first storage capacitor 313 due to the first rectified current supplied from the first rectifier circuit. At this time, a potential of the wiring 317 serves as a first potential.

Next, the second coupling capacitor 305 supplies a second alternating current to a wiring 318. A second rectifier circuit which is formed of the third diode 309 and the fourth diode 310 rectifies the second alternating current, generates a second rectified current, and supplies the second rectified current to a wiring 319. In addition, charge is stored in the second storage capacitor 314 due to the second rectified current supplied from the second rectifier circuit. At this time, a potential of the wiring 319, which equals to the sum of the first potential and the voltage of the second storage capacitor 314, serves as a second potential.

Further, the third coupling capacitor 306 supplies a third alternating current to a wiring 320. A third rectifier circuit which is formed of the fifth diode 311 and the sixth diode 312 rectifies the third alternating current, generates a third rectified current, and supplies the third rectified current to the power source wiring 303. In addition, charge is stored in the third storage capacitor 315 due to the third rectified current supplied from the third rectifier circuit. At this time, a potential of the power source wiring 303, which equals to the sum of the second potential and the voltage of the third storage capacitor 315, serves as a potential of a power supply voltage.

In FIG. 3B, the power supply circuit is a four-stage charge pump including first to fourth coupling capacitors 324 to 327, first to eighth diodes 328 to 335, and first to fourth storage capacitors 336 to 339. The power supply circuit has a function to generate a power supply voltage which is a direct voltage and to supply the power supply voltage to a power source wiring 323 when an alternating voltage is inputted between an antenna input wiring 321 and a ground wiring 322.

Here, the operation of this charge pump is described. First, the first coupling capacitor 324 converts the alternating voltage supplied from the antenna input wiring 321 into a first alternating current, and supplies the first alternating current to a wiring 340. A first rectifier circuit which is formed of the first diode 328 and the second diode 329 rectifies the first alternating current, generates a first rectified current, and supplies the first rectified current to a wiring 341. In addition, charge is stored in the first storage capacitor 336 due to the first rectified current supplied from the first rectifier circuit. At this time, a potential of the wiring 341 serves as a first potential.

Next, the second coupling capacitor 325 supplies a second alternating current to a wiring 342. A second rectifier circuit which is formed of the third diode 330 and the fourth diode 331 rectifies the second alternating current, generates a second rectified current, and supplies the second rectified current to a wiring 343. In addition, charge is stored in the second storage capacitor 337 due to the second rectified current supplied from the second rectifier circuit. At this time, a potential of the wiring 343, which equals to the sum of the first potential and the voltage of the second storage capacitor 337, serves as a second potential.

Next, the third coupling capacitor 326 supplies a third alternating current to a wiring 344. A third rectifier circuit which is formed of the fifth diode 332 and the sixth diode 333 rectifies the third alternating current, generates a third rectified current, and supplies the third rectified current to a wiring 345. In addition, charge is stored in the third storage capacitor 338 due to the third rectified current supplied from the third rectifier circuit. At this time, a potential of the wiring 345, which equals to the sum of the second potential and the voltage of the third storage capacitor 338, serves as a third potential.

Further, the fourth coupling capacitor 327 supplies a fourth alternating current to a wiring 346. A fourth rectifier circuit which is formed of the seventh diode 334 and the eighth diode 335 rectifies the fourth alternating current, generates a fourth rectified current, and supplies the fourth rectified current to the power source wiring 323. In addition, charge is stored in the fourth storage capacitor 339 due to the fourth rectified current supplied from the fourth rectifier circuit. At this time, a potential of the power source wiring 323, which equals to the sum of the third potential and the voltage of the fourth storage capacitor 339, serves as a potential of a power supply voltage.

Note that the power supply circuit described in this embodiment can be used as the power supply circuit in Embodiment Mode 1 and Embodiment Mode 2.

With the above-described structure, a high voltage can be generated from a weak communication signal. Therefore, by using the power supply circuit of this embodiment as the first power supply circuit 102, the power supply voltage of the data holding portion 128 in the memory circuit is easily supplied, and the data stored in the memory circuit can be held. That is, a high-performance RF tag which can electrically rewrite data such as ID data after production can be provided at a low price.

Embodiment 2

Figure 4:
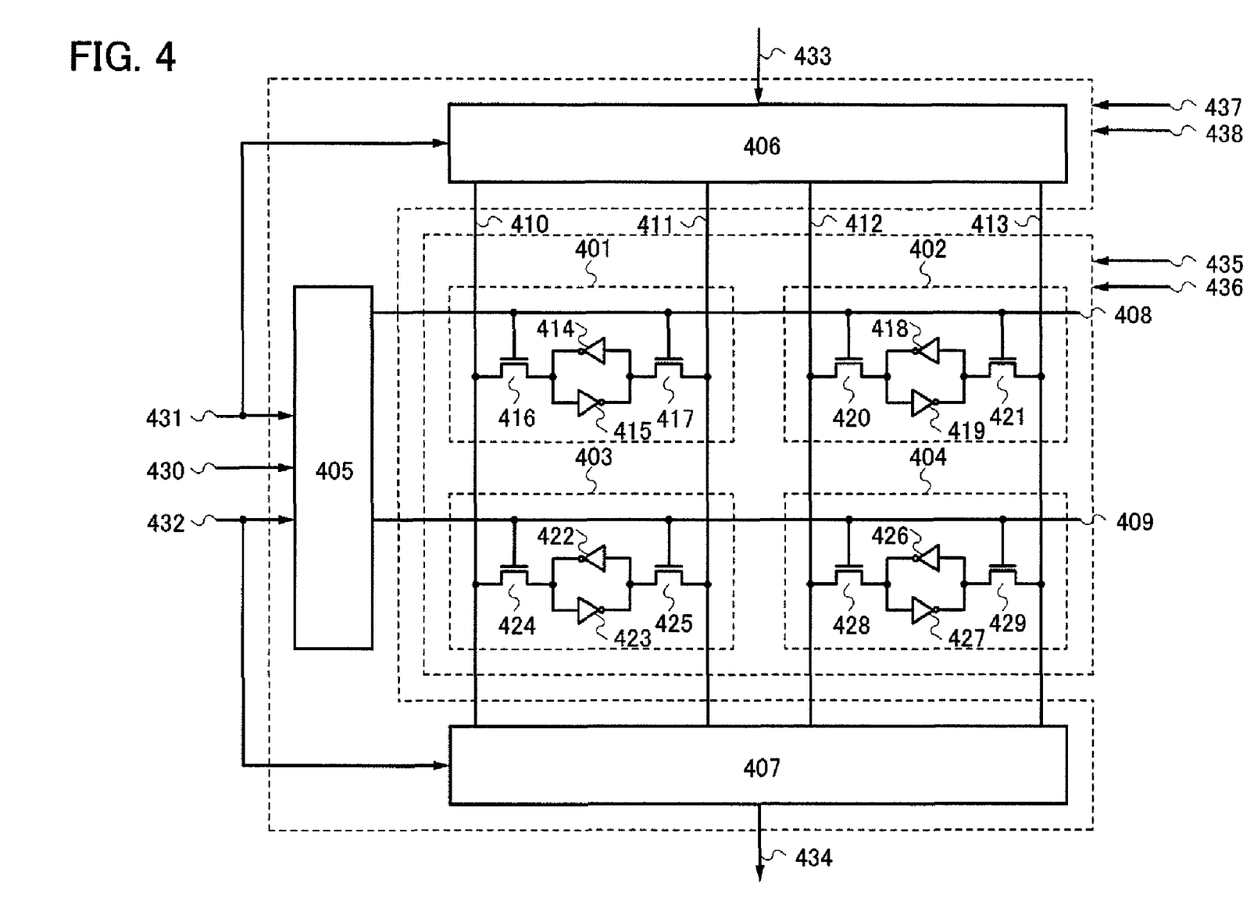
FIG. 4 is a circuit diagram of a memory circuit (SRAM) which is mounted on a semiconductor device of the present invention.

An embodiment of a memory circuit to be mounted on the RF tag of the present invention will be described with reference to FIG. 4. FIG. 4 is a circuit diagram in the case of using SRAM as the memory circuit to be mounted on the RF tag of the present invention. Note that, although SRAM having two rows and two columns is described in this embodiment, SRAM can generally have n row and m column (n and m: natural numbers).

In FIG. 4, the SRAM has first to fourth memory cells 401 to 404, a control circuit (an address decoder 405, a write circuit 406, and a read circuit 407). The first memory cell 401 is electrically connected to a first word line 408, a first bit line 410, and a first inverted bit line 411. The second memory cell 402 is electrically connected to the first word line 408, a second bit line 412, and a second inverted bit line 413. The third memory cell 403 is electrically connected to a second word line 409, the first bit line 410, and the first inverted bit line 411. The fourth memory cell 404 is electrically connected to the second word line 409, the second bit line 412, and the second inverted bit line 413.

The address decoder 405 has a function to generate a first word signal supplied to the first word line 408 and a second word signal supplied to the second word line 409 by using an address signal which is supplied from external to an address line 430, a write control signal which is supplied from external to a write control line 431, and a read control signal which is supplied from external to a read control line 432. Specifically, the address decoder 405 has a function to make the first word signal at an "H" level and the second word signal at an "L" level when the address signal is "0" and the write control signal is at an "H" level or the read control signal is at an "H" level. In addition, the address decoder 405 has a function to make the second word signal at an "H" level and the first word signal at an "L" level when the address signal is "1", the write control signal is at an "H" level or the read control signal is at an "H" level.

The write circuit 406 has a function to generate a first bit signal, a second bit signal, a first inverted bit signal, and a second inverted bit signal which are supplied to the first bit line 410, the second bit line 412, the first inverted bit line 411, and the second inverted bit line 413, respectively, by using a write data signal supplied from external to a writing data line 433 and a write control signal. Specifically, the write circuit 406 has a function to make the first bit signal at an "L" level, at an "H" level, at an "L" level, or at an "H" level; the second bit signal at an "L" level, at an "L" level, at an "H" level, or at an "H" level; the first inverted bit signal at an "H" level, at an "L" level, at an "H" level, or at an "L" level; and the second inverted bit signal at an "H" level, at an "H" level, at an "L" level, or at an "L" level when the write control signal is at an "H" level and the write data signal is at an "LL", at an "LH", at an "HL", or at an "HH" level, respectively. In addition, the write circuit 406 has a function to make the first bit line 410, the second bit line 412, the first inverted bit line 411, and the second inverted bit line 413 have floating potentials when the write control signal is at an "L" level.

The read circuit 407 has a function to generate a read data signal supplied from a read data line 434 to external, by using the read control signal, the first bit signal, the second bit signal, the first inverted bit signal, and the second inverted bit signal. Specifically, the read circuit 407 has a function to make read data signal at an "LL" level, at an "LH" level, at an "HL" level, or at an "HH" level when the read control signal is at an "H" level; the first bit signal is at an "L" level, at an "H" level, at an "L" level, or at an "H" level; the second bit signal is at an "L" level, at an "L" level, at an "H" level, or at an "H" level; the first inverted bit signal is at an "H" level, at an "L" level, at an "H" level, or at an "L" level; and the second inverted bit signal is at an "H" level, at an "H" level, at an "L" level, or at an "L" level, respectively.

The first memory cell 401 includes a first inverter 414, a second inverter 415, a first select transistor 416, and a second select transistor 417. Here, when the first bit signal is at an "H" level or at an "L" level, and the first inverted bit signal is at an "L" level or at an "H" level at the time when the first word signal is at an "H" level, data "H" or data "L" is respectively stored in the first memory cell 401. In addition, when data "H" or data "L" is stored in the first memory cell 401, after the first bit line 410 and the first inverted bit line 411 each have a floating potential, the first word signal is at an "H" level, so that the first bit signal is at an "H" level or at an "L" level, and the first inverted bit signal is at an "L" level or at an "H" level, respectively.

The second memory cell 402 includes a third inverter 418, a fourth inverter 419, a third select transistor 420, and a fourth select transistor 421. Here, when the second bit signal is at an "H" level or at an "L" level, and the second inverted bit signal is at an "L" level or at an "H" level at the time when the first word signal is at an "H" level, data "H" or data "L" is respectively stored in the second memory cell 402. In addition, when data "H" or data "L" is stored in the second memory cell 402, after the second bit line 412 and the second inverted bit line 413 each have a floating potential, the first word signal is at an "H" level, so that the second bit signal is at an "H" level or at an "L" level, and the second inverted bit signal is at an "L" level or at an "H" level, respectively.

The third memory cell 403 includes a fifth inverter 422, a sixth inverter 423, a fifth select transistor 424, and a sixth select transistor 425. Here, when the first bit signal is at an "H" level or at an "L" level, and the first inverted bit signal is at an "L" level or at an "H" level at the time when the second word signal is at an "H" level, data "H" or data "L" is respectively stored in the third memory cell 403. In addition, when data "H" or data "L" is stored in the third memory cell 403, after the first bit line 410 and the first inverted bit line 411 each have a floating potential, the second word signal is at an "H" level, so that the first bit signal is at an "H" level or at an "L" level, and the first inverted bit signal is at an "L" level or at an "H" level, respectively.

The fourth memory cell 404 includes a seventh inverter 426, an eighth inverter 427, a seventh select transistor 428, and an eighth select transistor 429. Here, when the second bit signal is at an "H" level or at an "L" level, and the second inverted bit signal is at an "L" level or at an "H" level at the time when the second word signal is at an "H" level, data "H" or data "L" is respectively stored in the fourth memory cell 404. In addition, when data "H" or data "L" is stored in the fourth memory cell 404, after the second bit line 412 and the second inverted bit line 413 each have a floating potential, the second word signal is at an "H" level, so that the second bit signal is at an "H" level or at an "L" level, and the second inverted bit signal is at an "L" level or at an "H" level, respectively.

A first power supply voltage and a first ground voltage are supplied from a first power source wiring 435 and a first ground wiring 436, respectively to the first to fourth memory cells 401 to 404. A second power supply voltage and a second ground voltage are supplied from a second power source wiring 437 and a second ground wiring 438, respectively to the address decoder 405, the write circuit 406, and the read circuit 407. Here, while the first power supply voltage is continued to be supplied, the data stored in the first to fourth memory cells 401 to 404 can be held even when the supply of the second power supply voltage is blocked. That is, the SRAM of this embodiment can be used as the memory circuit 103 in FIG. 1 of Embodiment Mode 1 and in FIG. 2 of Embodiment Mode 2. In this case, the control circuit (the address decoder 405, the write circuit 406, and the read circuit 407) is equivalent to the write control portion 129 and the memory cell (one of the first to fourth memory cells 401 to 404) is equivalent to the data holding portion 128.

With the above-described structure, a large capacity memory being capable of holding data can be provided, and a system structure of the RF tag can have flexibility. Therefore, a high-performance RF tag which can electrically rewrite data such as ID data after production can be provided at a low price.

Embodiment 3

Figure 5:
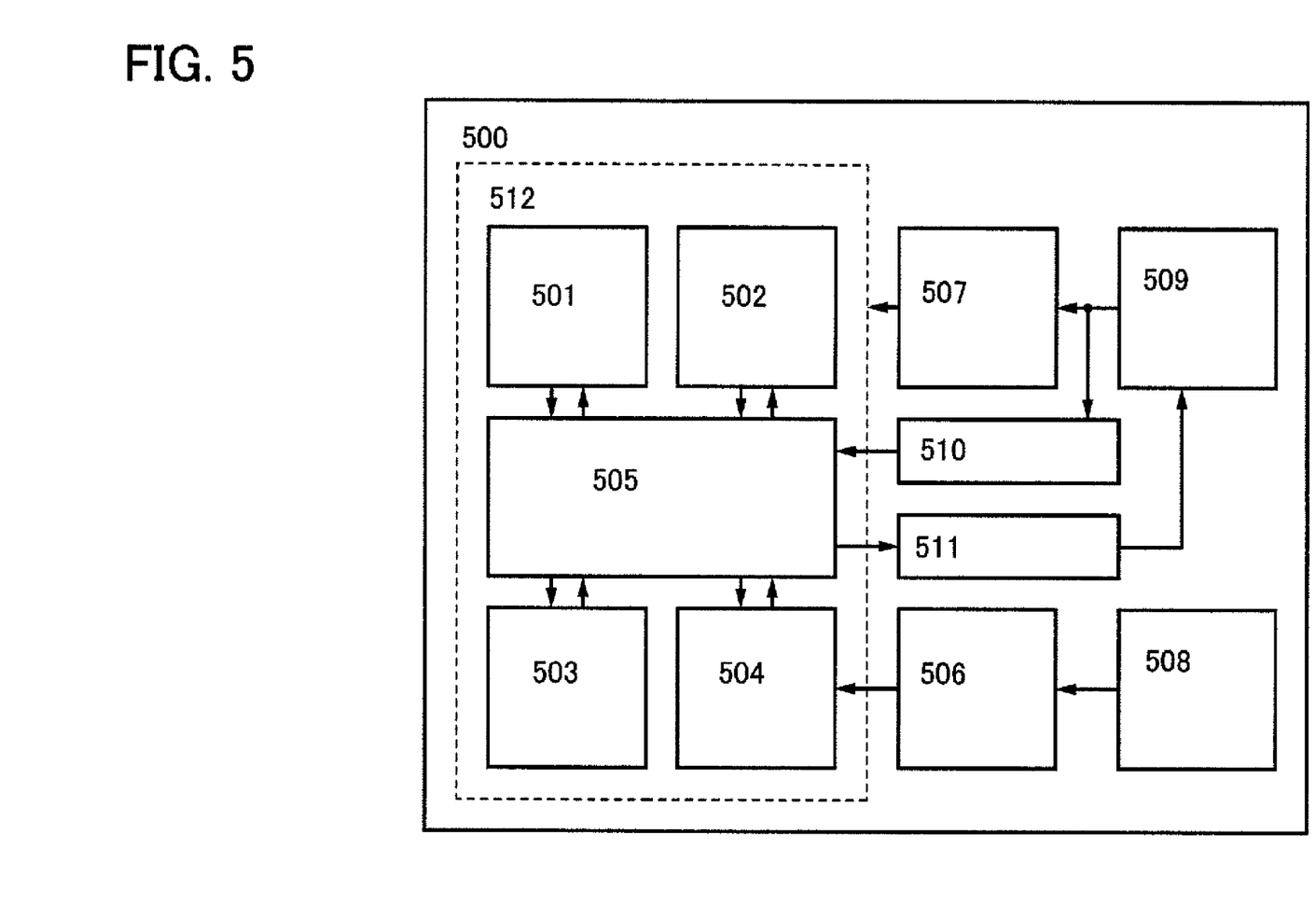
FIG. 5 is a block diagram of a semiconductor device of the present invention.

A structure of an RF tag which is one of the semiconductor devices of the present invention will be described with reference to FIG. 5. FIG. 5 is a block diagram of the RF tag of the present invention. In FIG. 5, there are an RF tag 500, a CPU (Central Processing Unit) 501, a ROM 502, a first RAM (Random Access Memory) 503, a second RAM 504, a controller 505, a first power supply circuit 506, a second power supply circuit 507, a first antenna circuit 508, a second antenna circuit 509, a demodulation circuit 510, and a modulation circuit 511. Note that a logic circuit portion 512 is formed of the CPU 501, the ROM 502, the first RAM 503, the second RAM 504, and the controller 505.

The first antenna circuit 508 has a function to convert a first communication signal, when a first communication signal is received, into a first alternating voltage and to supply the first alternating voltage to the first power supply circuit 506. The second antenna circuit 509 has a function to convert a second communication signal, when a second communication signal is received, into a second alternating voltage and to supply the second alternating voltage to the second power supply circuit 507. In addition, the second alternating voltage is also supplied to the demodulation circuit 510.

The first alternating voltage is converted into a first power supply voltage in the first power supply circuit 506. The second alternating voltage is converted into a second power supply voltage in the second power supply circuit 507. The first power supply voltage is supplied to the second RAM 504. The second power supply voltage is supplied to the logic circuit portion 512.

The demodulation circuit 510 has a function to rectify the second alternating voltage and to generate a rectification signal. The controller 505 extracts a command and data which are included in the second communication signal from the rectification signal.

The CPU 501 performs necessary processing in accordance with the command and data extracted in the controller 505. For example, decryption, data processing, and the like are considered. These processing programs are stored in the ROM 502 or the second RAM 504. Note that, when the CPU 501 performs processing, the first RAM 503 and the second RAM 504 can be used as working areas.

In the RF tag of this embodiment, the first power supply circuit 102, the second power supply circuit 105, the first antenna circuit 101, and the second antenna circuit 104 shown in FIGS. 1 and 2 described in Embodiment Mode 1 and Embodiment Mode 2 correspond to the first power supply circuit 506, the second power supply circuit 507, the first antenna circuit 508, and the second antenna circuit 509 shown in FIG. 5, respectively. In addition, the memory circuit 103 shown in FIGS. 1 and 2 corresponds to the second RAM 504 in FIG. 5. More specifically, the SRAM of FIG. 4 in Embodiment 2 can be used as the second RAM 504 in FIG. 5.

That is, in the RF tag of this embodiment, the second RAM 504 in FIG. 5 can hold stored data by continuously supplying the first communication signal even when the signal strength of the second communication signal decreases. Accordingly, for example, data such as a unique number or a program such as encryption processing can be stored. By storing a unique number, a unique number can be written after production. Further, by storing an encryption processing program, a current encryption processing program can be easily updated, and encryption processing with higher safety can be performed.

With the above-described structure, a memory being capable of holding data can be provided, and the system structure of the RF tag can have flexibility. Therefore, a high-performance RF tag can be provided at a low price.

Embodiment 4

Figure 6:
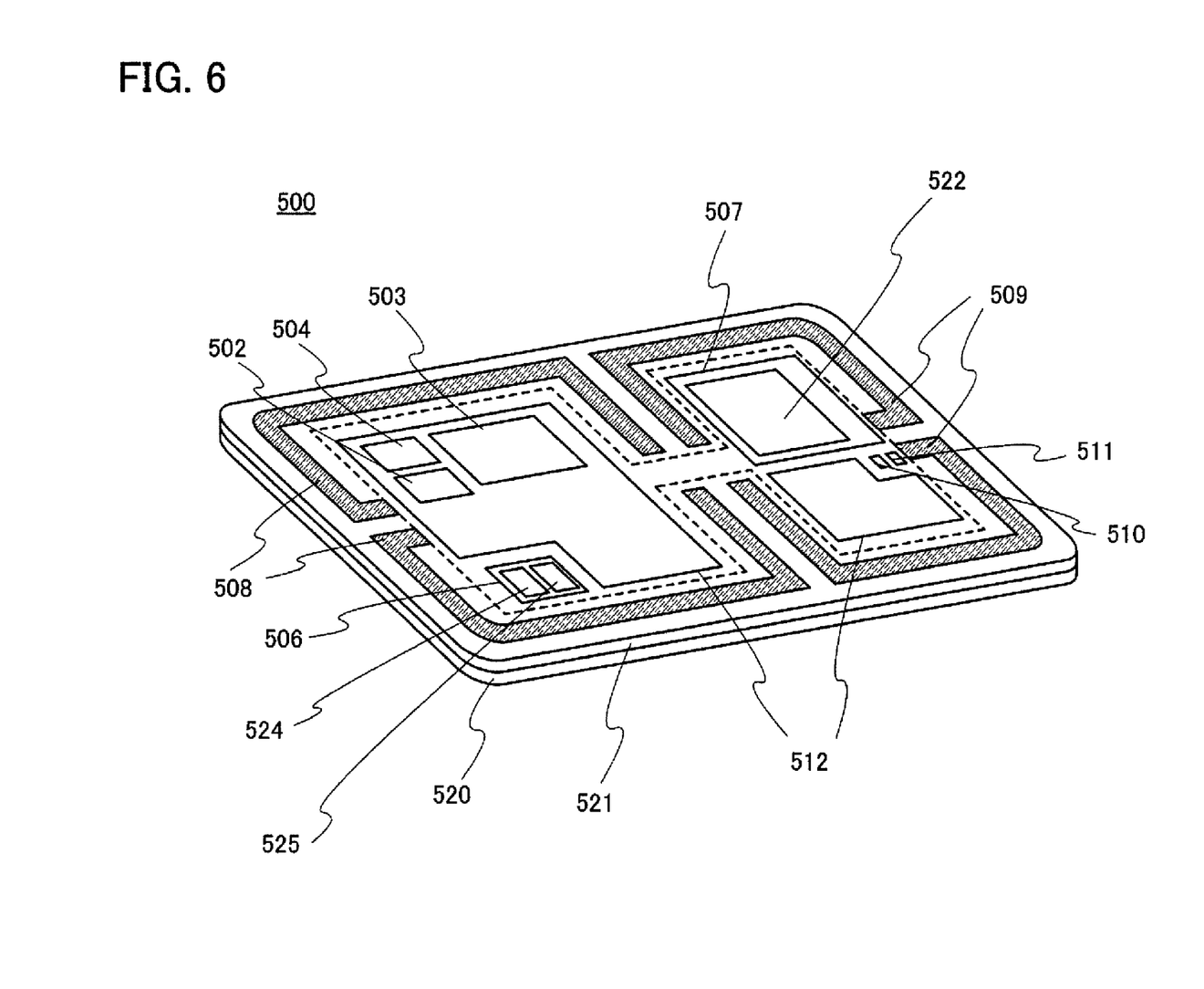
FIG. 6 is a perspective diagram of a semiconductor device of the present invention.

FIG. 6 is a perspective diagram showing one mode of the RF tag shown in FIG. 5.

In FIG. 6, the RF tag 500 has a substrate 520 and a cover material 521. As the substrate 520, a glass substrate, a quartz substrate, a plastic substrate, or a SOI substrate can be used. As the cover material 521, a glass substrate, a quartz substrate, or a plastic substrate can be used.

The logic circuit portion 512, the first power supply circuit 506, the second power supply circuit 507, the demodulation circuit 510, and the modulation circuit 511 are formed over the substrate 520. The cover material 521 overlaps the substrate 520 so as to cover the logic circuit portion 512, the first power supply circuit 506, the second power supply circuit 507, the demodulation circuit 510, the modulation circuit 511, the first antenna circuit 508, and the second antenna circuit 509. Note that the first antenna circuit 508 and the second antenna circuit 509 may be formed over the substrate 520, or the first antenna circuit 508 and the second antenna circuit 509 may be prepared separately and then attached on the substrate 520.

The first power supply circuit 506 has a first storage capacitor 524 and a second storage capacitor 525. Electric energy can be stored in the first storage capacitor 524 and the second storage capacitor 525. The second power supply circuit 507 has a storage capacitor 522. Electric energy can be stored in the storage capacitor 522.

The communication between the RF tag 500 and a reader/writer can be performed by modulating electric waves which are used as carriers (carrier waves). In this embodiment, the structure of the RF tag using a carrier of 950 MHz is described; however, frequency of a carrier is not limited thereto. Electric waves having various frequencies such as 125 KHz or 13.56 MHz can be used as carriers. Transmission methods of a signal can be classified into various kinds such as an electromagnetic coupling method, an electromagnetic induction method, and a microwave method in accordance with a wavelength of a carrier. As a modulation method, there are various methods such as amplitude modulation, frequency modulation, and phase modulation; however, the present invention is not particularly limited.

In this embodiment, since the RF tag in the case where communication is performed by using an electric field is exemplified, dipole antennas are used as the antenna circuit 508 and the antenna circuit 509. In the case where communication is performed by using a magnetic field instead of an electric field, coiled antennas can be used as the antenna circuit 508 and the antenna circuit 509.

In this embodiment, the structure of the RF tag 500 having the antenna circuit 508 and the antenna circuit 509 are described; however, the RF tag of the present invention does not necessarily have both the antenna circuit 508 and the antenna circuit 509. The RF tag of the present invention may have either one of the antenna circuit 508 and the antenna circuit 509. In addition, the RF tag shown in FIG. 6 may be provided with an oscillator circuit.

The RF tag of the present invention including a capacitor can be formed by a normal MOS process. Therefore, miniaturization of the RF tag is possible.

This embodiment can be combined with any of Embodiment Modes 1 and 2, and Embodiments 1 to 3, as appropriate.

This application is based on Japanese Patent Application serial No. 2006-282084 filed in Japan Patent Office on Oct. 17, 2006, the entire contents of which are hereby incorporated by reference.

What is claimed is:

1. A semiconductor device comprising:
a first antenna circuit;
a second antenna circuit;
a first power supply circuit configured to generate a first direct voltage by converting a first radio signal received by the first antenna circuit into a direct voltage and boosting the direct voltage;
a second power supply circuit configured to generate a second direct voltage from a second radio signal received by the second antenna circuit; and
a memory circuit comprising a memory cell and a control circuit,
wherein the memory cell is configured to hold a signal by using the first direct voltage, and
wherein the control circuit is configured to control the memory cell by using the second direct voltage.

2. The semiconductor device according to claim 1, wherein the first radio signal and the second radio signal have different frequencies.

3. The semiconductor device according to claim 1, wherein the first radio signal and the second radio signal have different electric powers.

4. The semiconductor device according to claim 1, wherein the first power supply circuit includes a charge pump circuit.

5. The semiconductor device according to claim 1, wherein the memory cell includes a latch circuit.

6. The semiconductor device according to claim 1, wherein the memory cell includes a flip-flop circuit.

7. The semiconductor device according to claim 1, wherein the memory circuit is a static random access memory.

8. The semiconductor device according to claim 1, wherein any one of the first power supply circuit, the second power supply circuit, and the memory circuit uses a thin film transistor in which a semiconductor thin film formed over a substrate including an insulating surface serves as an active layer.

9. The semiconductor device according to claim 8, wherein the substrate including the insulating surface is any one of a glass substrate, a quartz substrate, a plastic substrate, and a silicon on insulator substrate.

10. A semiconductor device comprising:
a first antenna circuit;
a second antenna circuit;
a first power supply circuit configured to generate a first direct voltage by converting a radio signal received by the first antenna circuit into a direct voltage and boosting the direct voltage;
a second power supply circuit configured to generate a second direct voltage from the radio signal received by the second antenna circuit; and
a memory circuit comprising a memory cell and a control circuit,
wherein the memory cell is configured to hold a signal by using the first direct voltage, and
wherein the control circuit is configured to control the memory cell by using the second direct voltage.

11. The semiconductor device according to claim 10, wherein one of the first power supply circuit and the second power supply circuit includes a charge pump circuit.

12. The semiconductor device according to claim 10, wherein the memory cell includes a latch circuit.

13. The semiconductor device according to claim 10, wherein the memory cell includes a flip-flop circuit.

14. The semiconductor device according to claim 10, wherein the memory circuit is a static random access memory.

15. The semiconductor device according to claim 10, wherein any one of the first power supply circuit, the second power supply circuit, and the memory circuit uses a thin film transistor in which a semiconductor thin film formed over a substrate including an insulating surface serves as an active layer.

16. The semiconductor device according to claim 15, wherein the substrate including the insulating surface is any one of a glass substrate, a quartz substrate, a plastic substrate, and a silicon on insulator substrate.

17. A semiconductor device comprising:
a first antenna circuit;
a second antenna circuit;
a first power supply circuit;
a second power supply circuit; and
a memory circuit comprising a memory cell for holding a signal by using an output voltage from the first power supply circuit and a control circuit for controlling the memory cell by using an output voltage from the second power supply circuit,
wherein the first power supply circuit is configured to generate a first direct voltage from a first radio signal received by the first antenna circuit,
wherein the second power supply circuit is configured to generate a second direct voltage from a second radio signal received by the second antenna circuit, and
wherein when the output voltage from the second power supply circuit is larger than the output voltage from the first power supply circuit, the memory cell is configured to hold the signal by using the output voltage from the second power supply circuit.

18. The semiconductor device according to claim 17, wherein one of the first power supply circuit and the second power supply circuit includes a charge pump circuit.

19. The semiconductor device according to claim 17, wherein the memory circuit includes a latch circuit.

20. The semiconductor device according to claim 17, wherein the memory circuit includes a flip-flop circuit.

21. The semiconductor device according to claim 17, wherein the memory circuit is a static random access memory.

22. The semiconductor device according to claim 17, wherein any one of the first power supply circuit, the second power supply circuit, and the memory circuit uses a thin film transistor in which a semiconductor thin film formed over a substrate including an insulating surface serves as an active layer.

23. The semiconductor device according to claim 22, wherein the substrate including the insulating surface is any one of a glass substrate, a quartz substrate, a plastic substrate, and a silicon on insulator substrate.

24. A semiconductor device comprising:
a first antenna circuit;
a second antenna circuit;
a first power supply circuit;
a second power supply circuit; and
a memory circuit,
wherein the first power supply circuit is configured to generate a first direct voltage by converting a first radio signal received by the first antenna circuit into a direct voltage and boosting the direct voltage,
wherein the second power supply circuit is configured to generate a second direct voltage from a second radio signal received by the second antenna circuit, and
wherein the memory circuit is configured to operate by using the second direct voltage and to hold data by using the first direct voltage.

25. The semiconductor device according to claim 24, wherein one of the first power supply circuit and the second power supply circuit includes a charge pump circuit.

26. The semiconductor device according to claim 24, wherein the memory circuit includes a latch circuit.

27. The semiconductor device according to claim 24, wherein the memory circuit includes a flip-flop circuit.

28. The semiconductor device according to claim 24, wherein the memory circuit is a static random access memory.

29. The semiconductor device according to claim 24, wherein any one of the first power supply circuit, the second power supply circuit, and the memory circuit uses a thin film transistor in which a semiconductor thin film formed over a substrate including an insulating surface serves as an active layer.

30. The semiconductor device according to claim 29, wherein the substrate including the insulating surface is any one of a glass substrate, a quartz substrate, a plastic substrate, and a silicon on insulator substrate.

* * * * *